(12) United States Patent
Ho et al.

(10) Patent No.: US 9,355,975 B2
(45) Date of Patent: May 31, 2016

(54) CHIP PACKAGE AND METHOD FOR FORMING THE SAME

(71) Applicant: XINTEC INC., Jhongli, Taoyuan County (TW)

(72) Inventors: Yen-Shih Ho, Kaohsiung (TW); Tsang-Yu Liu, Zhubei (TW); Shu-Ming Chang, New Taipei (TW); Yu-Lung Huang, Daxi Township (TW); Chao-Yen Lin, New Taipei (TW); Wei-Luen Suen, New Taipei (TW); Chien-Hui Chen, Zhongli (TW); Chi-Chang Liao, Pingtung (TW)

(73) Assignee: XINTEC INC., Taoyuan (TW)

( * ) Notice: Subject to any disclaimer, the term of this patent is extended or adjusted under 35 U.S.C. 154(b) by 0 days.

(21) Appl. No.: 14/339,355

(22) Filed: Jul. 23, 2014

(65) Prior Publication Data

US 2014/0332969 A1 Nov. 13, 2014

Related U.S. Application Data

(63) Continuation-in-part of application No. 13/950,101, filed on Jul. 24, 2013, now Pat. No. 8,952,501, which is a continuation-in-part of application No. 13/105,775, filed on May 11, 2011, now Pat. No. 8,507,321.

(60) Provisional application No. 62/002,774, filed on May 23, 2014, provisional application No. 61/333,459, filed on May 11, 2010.

(51) Int. Cl.
*H01L 23/00* (2006.01)
*H01L 21/78* (2006.01)
(Continued)

(52) U.S. Cl.
CPC .............. *H01L 24/05* (2013.01); *H01L 21/561* (2013.01); *H01L 21/76838* (2013.01); *H01L 21/78* (2013.01); *H01L 23/3121* (2013.01); *H01L 29/0657* (2013.01); *H01L 23/3192* (2013.01); *H01L 23/525* (2013.01); *H01L 23/5329* (2013.01); *H01L 24/16* (2013.01); *H01L 24/32* (2013.01); *H01L 24/45* (2013.01); *H01L 24/48* (2013.01); *H01L 24/73* (2013.01);
(Continued)

(58) Field of Classification Search
CPC ..................... H01L 29/0657; H01L 21/76232; H01L 21/764; H01L 29/0661; H01L 29/6609
See application file for complete search history.

(56) References Cited

U.S. PATENT DOCUMENTS

| 5,478,781 | A | 12/1995 | Bertin et al. |
| 7,199,345 | B1 | 4/2007 | Meisel et al. |

(Continued)

FOREIGN PATENT DOCUMENTS

| CN | 103107153 | 5/2013 |
| JP | 2002-151546 | 5/2002 |

(Continued)

*Primary Examiner* — Michelle Mandala
(74) *Attorney, Agent, or Firm* — Liu & Liu

(57) ABSTRACT

A chip package including a chip having an upper surface, a lower surface and a sidewall is provided. The chip includes a signal pad region adjacent to the upper surface. A first recess extends from the upper surface toward the lower surface along the sidewall. At least one second recess extends from a first bottom of the first recess toward the lower surface. The first and second recesses further laterally extend along a side of the upper surface, and a length of the first recess extending along the side is greater than that of the second recess extending along the side. A redistribution layer is electrically connected to the signal pad region and extends into the second recess. A method for forming the chip package is also provided.

18 Claims, 5 Drawing Sheets

(51) Int. Cl.
    *H01L 21/768*     (2006.01)
    *H01L 23/31*     (2006.01)
    *H01L 21/56*     (2006.01)
    *H01L 29/06*     (2006.01)
    *H01L 23/525*     (2006.01)
    *H01L 23/532*     (2006.01)
    *H01L 25/065*     (2006.01)

(52) U.S. Cl.
CPC ...... *H01L 25/0657* (2013.01); *H01L 2224/024* (2013.01); *H01L 2224/02381* (2013.01); *H01L 2224/0401* (2013.01); *H01L 2224/04042* (2013.01); *H01L 2224/0569* (2013.01); *H01L 2224/05548* (2013.01); *H01L 2224/05558* (2013.01); *H01L 2224/05567* (2013.01); *H01L 2224/05572* (2013.01); *H01L 2224/05611* (2013.01); *H01L 2224/05624* (2013.01); *H01L 2224/05644* (2013.01); *H01L 2224/05647* (2013.01); *H01L 2224/05655* (2013.01); *H01L 2224/05669* (2013.01); *H01L 2224/05687* (2013.01); *H01L 2224/16225* (2013.01); *H01L 2224/32145* (2013.01); *H01L 2224/32225* (2013.01); *H01L 2224/45144* (2013.01); *H01L 2224/4869* (2013.01); *H01L 2224/48091* (2013.01); *H01L 2224/48145* (2013.01); *H01L 2224/48227* (2013.01); *H01L 2224/48611* (2013.01); *H01L 2224/48624* (2013.01); *H01L 2224/48644* (2013.01); *H01L 2224/48647* (2013.01); *H01L 2224/48655* (2013.01); *H01L 2224/48669* (2013.01); *H01L 2224/48687* (2013.01); *H01L 2224/73203* (2013.01); *H01L 2224/73265* (2013.01); *H01L 2224/94* (2013.01); *H01L 2924/00014* (2013.01); *H01L 2924/10155* (2013.01); *H01L 2924/10523* (2013.01); *H01L 2924/12041* (2013.01); *H01L 2924/14* (2013.01); *H01L 2924/1461* (2013.01); *H01L 2924/3701* (2013.01)

(56) References Cited

U.S. PATENT DOCUMENTS

| | | | |
|---|---|---|---|
| 8,736,080 | B2 | 5/2014 | Arnold et al. |
| 2008/0096321 | A1 | 4/2008 | Lin et al. |
| 2008/0315407 | A1 | 12/2008 | Andrews, Jr. et al. |
| 2011/0278724 | A1 | 11/2011 | Lin et al. |
| 2011/0281138 | A1* | 11/2011 | Yoshioka et al. ............. 428/815 |
| 2013/0285240 | A1* | 10/2013 | Last et al. .................... 257/738 |
| 2013/0343022 | A1 | 12/2013 | Hu et al. |

FOREIGN PATENT DOCUMENTS

| | | |
|---|---|---|
| JP | 2004-363400 | 12/2004 |
| TW | 201140779 | 11/2011 |

\* cited by examiner

CHIP PACKAGE AND METHOD FOR FORMING THE SAME

CROSS REFERENCE TO RELATED APPLICATIONS

This Application claims the benefit of U.S. Provisional Application No. 62/002,774, filed May 23, 2014 and is a Continuation-In-Part of U.S. patent application Ser. No. 13/950,101, filed Jul. 24, 2013, which is a Continuation-In-Part of U.S. Pat. No. 8,507,321, filed May 11, 2011, which claims the benefit of U.S. Provisional Application No. 61/333,459, filed May 11, 2010, the entirety of which are incorporated by reference herein.

BACKGROUND OF THE INVENTION

1. Field of the Invention

The invention relates to chip package technology, and in particular to a chip package and methods for forming the same.

2. Description of the Related Art

The chip packaging process is an important step in the fabrication of an electronic product. Chip packages not only protect the chips therein from outer environmental contaminants, but they also provide electrical connection paths between electronic elements inside and those outside of the chip packages. Conventional manufacturing processes of chip packages concern multiple patterning processes and material-deposition processes, which not only cost a lot but also require a long processing time.

Thus, there exists a need in the art for development of a chip package and methods for forming the same capable of mitigating or eliminating the aforementioned problems, and providing a simplified and fast chip-packaging technique.

BRIEF SUMMARY OF THE INVENTION

An embodiment of the invention provides a chip package comprising a chip having an upper surface, a lower surface and a sidewall. The chip comprises a signal pad region adjacent to the upper surface. A first recess extends from the upper surface toward the lower surface along the sidewall. At least one second recess extends from a first bottom of the first recess toward the lower surface. The first and second recesses further laterally extend along a side of the upper surface, and a length of the first recess extending along the side is greater than that of the second recess extending along the side. A redistribution layer is electrically connected to the signal pad region and extends into the second recess.

An embodiment of the invention provides a method for forming a chip package comprising providing a wafer having a plurality of chips, wherein each chip has an upper surface and a lower surface and comprises a signal pad region adjacent to the upper surface. A first recess is formed and extends from the upper surface toward the lower surface. At least one second recess is formed and extends from a first bottom of the first recess toward the lower surface. A redistribution layer extending into the second recess is formed to electrically connect to the signal pad region. The wafer is diced to separate the plurality of chips, such that each chip has a sidewall and the first recess extends along the sidewall. The first and second recesses further laterally extend a side of the upper surface. A length of the first recess extending along the side is greater than that of the second recess extending along the side.

A detailed description is given in the following embodiments with reference to the accompanying drawings.

BRIEF DESCRIPTION OF THE DRAWINGS

The present invention can be more fully understood by reading the subsequent detailed description and examples with references made to the accompanying drawings, wherein.

DETAILED DESCRIPTION OF THE INVENTION

The making and using of the embodiments of the present disclosure are discussed in detail below. However, it should be noted that the embodiments provide many applicable inventive concepts that can be embodied in a variety of specific methods. The specific embodiments discussed are merely illustrative of specific methods to make and use the embodiments, and do not limit the scope of the disclosure. The disclosed contents of the present disclosure include all the embodiments derived from claims of the present disclosure by those skilled in the art. In addition, the present disclosure may repeat reference numbers and/or letters in the various embodiments. This repetition is for the purpose of simplicity and clarity, and does not imply any relationship between the different embodiments and/or configurations discussed. Furthermore, when a first layer is referred to as being on or overlying a second layer, the first layer may be in direct contact with the second layer, or spaced apart from the second layer by one or more material layers.

A chip package according to an embodiment of the present invention may be used to package micro-electro-mechanical system chips. However, embodiments of the invention are not limited thereto. For example, the chip package of the embodiments of the invention may be implemented to package active or passive devices or electronic components of integrated circuits, such as digital or analog circuits. For example, the chip package is related to optoelectronic devices, micro-electro-mechanical systems (MEMS), microfluidic systems, and physical sensors measuring changes to physical quantities such as heat, light, capacitance, pressure, and so on. In particular, a wafer-level package (WSP) process may optionally be used to package semiconductor chips, such as image-sensor elements, light-emitting diodes (LEDs), solar cells, RF circuits, accelerators, gyroscopes, microactuators, surface acoustic wave devices, pressure sensors, ink printer heads, and so on.

The above-mentioned wafer-level package process mainly means that after the package step is accomplished during the wafer stage, the wafer with chips is cut to obtain individual packages. However, in a specific embodiment, separated semiconductor chips may be redistributed on a carrier wafer and then packaged, which may also be referred to as a wafer-level package process. In addition, the above-mentioned wafer-level package process may also be adapted to form a chip package having multi-layer integrated circuit devices by stacking a plurality of wafers having integrated circuits.

Figure 6:
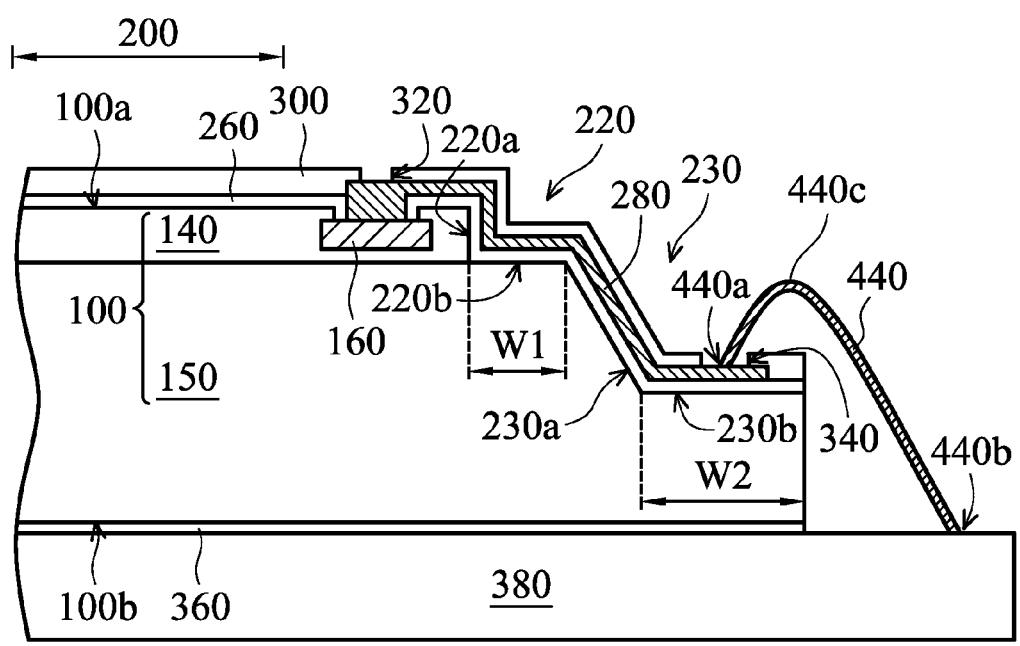

Referring to FIG. 6, a cross-sectional view of an exemplary embodiment of a chip package according to the invention is illustrated. To simplify the diagram, only a portion of the chip package is shown herein. In the embodiment, the chip package comprises a chip 100, a first recess 220, a second recess 230 and a redistribution layer (RDL) 280. The chip 100 has an upper surface 100a and a lower surface 100b. In one embodiment, the chip 100 comprises an insulating layer 140 adjacent to the upper surface 100a and an underlying substrate 150 adjacent to the lower surface 100b. In general, the insulating layer 140 may comprise an interlayer dielectric (ILD), an inter-metal dielectric (IMD) and a passivation layer. In the embodiment, the insulating layer 140 may comprise inorganic materials, such as silicon oxide, silicon nitride, silicon oxynitride, metal oxide, a combination thereof, or another suitable insulating material. In the embodiment, the substrate 150 may comprise silicon or another semiconductor material.

In the embodiment, the chip 100 may comprise a signal pad region 160 and a sensing region or device region 200 which may be adjacent to the upper surface 100a. In one embodiment, the signal pad region 160 comprises a plurality of conducting pads and each conducting pad may be a single conducting layer or comprise multiple conducting layers. To simplify the diagram, only one conducting pad comprising a single conducting layer in the insulating layer 140 is depicted herein as an example. In the embodiment, the insulating layer 140 may comprise one or more openings exposing the respective conducting pads.

In one embodiment, the sensing region or device region 200 of the chip 100 comprises a sensing component which may be used for sensing biometric features (i.e., the chip 100 is a biometric sensing chip, such as a fingerprint-recognition chip). In another embodiment, the chip 100 may be used for sensing environmental features. For example, the chip 100 may comprise a temperature-sensing component, a humidity-sensing component, a pressure-sensing component, a capacitance-sensing component or another suitable sensing component. In yet another embodiment, the chip 100 may comprise an image-sensing component. In one embodiment, the sensing component in the chip 100 may be electrically connected to the signal pad region 160 by an interconnection structure (not shown) in the insulating layer 140.

In one embodiment, the first recess 220 is located outside of the sensing region or device region 200 and the signal pad region 160 and extends from the upper surface 100a toward the lower surface 100b along a sidewall of the chip 100 to expose the underlying substrate 150. In other embodiments, the first recess 220 may be located outside of the sensing region or device region 200 and expose the underlying substrate 150.

The first recess 220 has a first sidewall 220a and a first bottom 220b. In the embodiment, the first sidewall 220a is an edge of the insulating layer 140. Moreover, the first bottom 220b may be located at or lower than an interface between the insulating layer 140 and the substrate 150. In one embodiment, the first sidewall 220a may substantially be perpendicular to the upper surface 100a. In other embodiments, the first sidewall 220a may be inclined to the upper surface 100a. In addition, the first bottom 220b is not limited to being parallel to the upper surface 100a.

Figure 7:
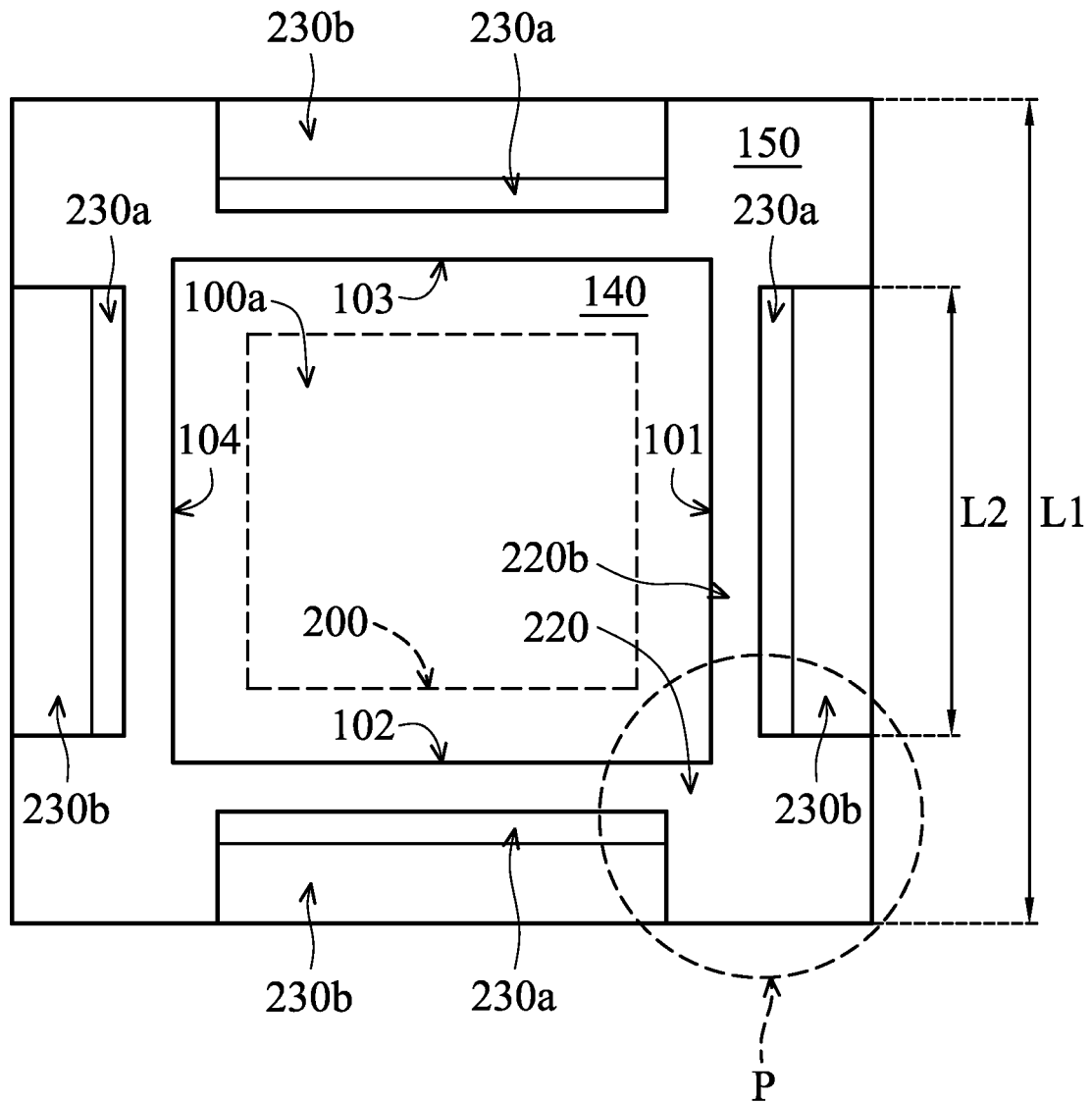
FIG. 7 is a plan view of an exemplary embodiment of a chip package according to the invention.

In one embodiment, the first recess 220 laterally extends across the entire length of four sides 101, 102, 103 and 104 of the upper surface 100a, such that the sides 101, 102, 103 and 104 shift toward the inside of the upper surface 100a, as shown in FIG. 7. In another embodiment, the first recess 220 may laterally extend across the entire length of the side 101 and further extend along the partial or entire length of the adjacent side 102 or 103 without extending along the side 104. In yet another embodiment, the first recess 220 may laterally extend across the entire length of the side 101 and further extend along the partial or entire length of the two adjacent sides 102 and 103 without extending along the side 104. In other embodiments, the first recess 220 may laterally extend along the partial or entire length of the side 101 without extending along the sides 102, 103 and 104.

The second recess 230 extends from the first bottom 220b of first recess 220 toward the lower surface 100b along the sidewall of the chip 100. The second recess 230 has a second sidewall 230a and a second bottom 230b. In the embodiment, the second sidewall 230a is substantially perpendicular to the upper surface 100a. In other embodiments, the second sidewall 230a may be inclined to the upper surface 100a. In addition, the second bottom 230b is not limited to being parallel to the upper surface 100a.

Figure 8:
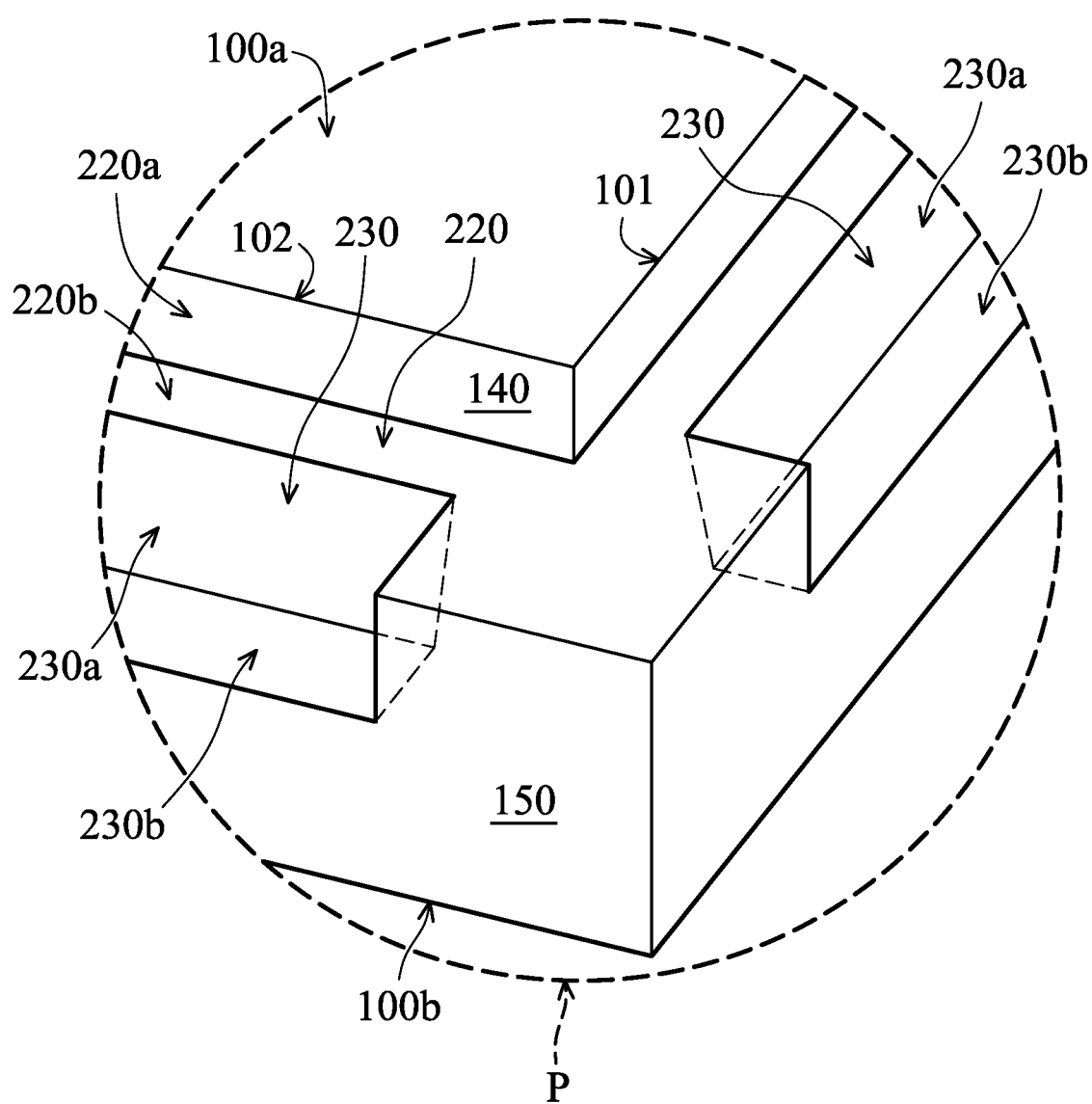
FIG. 8 is a magnified perspective view of a portion P of the chip package shown in FIG. 7.

In the embodiment, as shown in FIGS. 7 and 8, the chip package may comprise a plurality of individual second recesses 230, which extend from the first bottom 220b toward the lower surface 100b along the partial length of the sides 101, 102, 103 and 104 of the upper surface 100a, respectively. Moreover, the length L1 of the first recess 220 laterally extending along the side 101 is greater than the length L2 of the second recess 230 laterally extending along the side 101. Similarly, the length of the first recess 220 laterally extending along the side 102, 103 or 104 is greater than that of the respective second recess 230 laterally extending along the same side 102, 103 or 104. In addition, although not shown in the figures, it should be realized that the length of the first recess 220 and the location, number and size of the second recess 230 may have other arrangements as long as the length of the first recess 220 laterally extending along the side of the upper surface 100a is greater than that of the respective second recess 230 laterally extending along the same side. For example, the chip package may merely comprise one second recess extending along the partial length of the side 101, 102, 103 or 104 while the first recess 220 may extend along the entire length of the same side.

Figure 3:
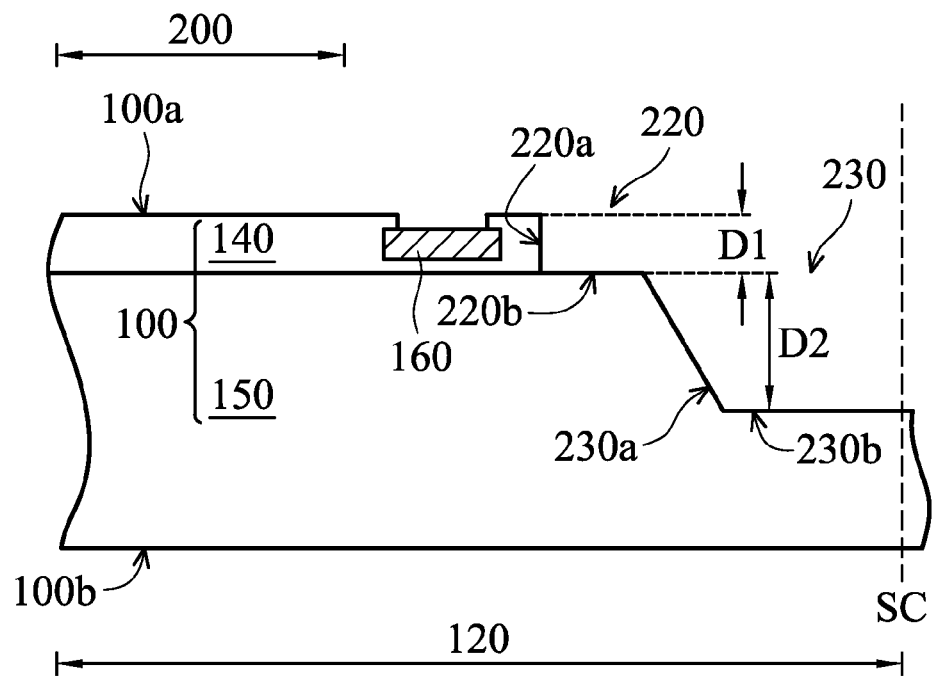

In the embodiment, the first recess 220 is has the depth D1 less than the depth D2 of the second recess 230, shown in FIG. 3. Moreover, the first bottom 220b is has the width W1 less than the width W2 of the second bottom 230b.

In one embodiment, an optional insulating layer 260 may be conformally disposed on the upper surface 100a of the chip 100. The insulating layer 260 extends onto the second sidewall 230a and the second bottom 230b through the first recess 220, and exposes a portion of the signal pad region 160. In the embodiment, the insulating layer 260 may comprise inorganic materials, such as silicon oxide, silicon nitride, silicon oxynitride, metal oxide, a combination thereof, or another suitable insulating material.

The redistribution layer 280 is patterned and conformally disposed on the insulating layer 260. The redistribution layer 280 extends onto the second sidewall 230a and the second bottom 230b and is electrically connected to the exposed signal pad region 160. In one embodiment, the redistribution layer 280 does not reach an edge of the second bottom 230b. In one embodiment, when the substrate 150 comprises a semiconductor material, the redistribution layer 280 can be electrically insulated from the semiconductor material by the insulating layer 260. In one embodiment, the redistribution layer 280 may comprise copper, aluminum, gold, platinum, nickel, tin, a combination thereof, conductive polymer materials, conductive ceramic materials (such as indium tin oxide or indium zinc oxide), or another suitable conducting material.

A protection layer 300 is conformally disposed on the redistribution layer 280 and the insulating layer 260 and extends into the first recess 220 and the second recess 230.

The protection layer 300 comprises one or more openings exposing a portion of the redistribution layer 280. In the embodiment, the protection layer 300 comprises openings 320 and 340 respectively exposing the redistribution layer 280 on the signal pad region 160 and in the second recess 230. In another embodiment, the protection layer 300 may merely comprise the opening 340. For example, the redistribution layer 280 on the signal pad region 160 may be fully covered by the protection layer 300. In other embodiments, the protection layer 300 may comprise a plurality of openings 340 exposing portions of the redistribution layer 280 in the second recess 230. In the embodiment, the protection layer 300 may comprise inorganic materials, such as silicon oxide, silicon nitride, silicon oxynitride, metal oxide, a combination thereof, or another suitable insulating material.

Another chip, such as a processor, an interposer or a circuit board 380 is attached onto the lower surface 100b by an adhesive layer (such as a glue) 360 and is electrically connected to the signal pad region 160 through the redistribution layer 280 extending into the second recess 230 and a conducting structure 440, such as a conducting bump or a bonding wire. In other embodiments, a circuit board (not shown) may additionally be disposed under the chip or interposer 380 to form a stacked chip package. Using the wire as an example, the wire 440 has a first end 440a disposed on and electrically connected to the redistribution layer 280 extending into the second recess 230 through the opening 340, and a second end 440b disposed on and electrically connected to the chip, interposer or circuit board 380. In other embodiments, the first end 440a of the wire 440 may be disposed on and electrically connected to the redistribution layer 280 on the signal pad region 160 through the opening 320.

In one embodiment, the highest portion 440c of the wire 440 is lower than the upper surface 100a. In other embodiments, the highest portion 440c of the wire 440 may protrude from the upper surface 100a. Moreover, the wire 440 may comprise gold or another suitable conducting material.

An encapsulant layer (not shown) may optionally cover the conducting structure 440 and a portion of the chip 100 or it may further extend onto the upper surface 100a to form a flat contacting region above the sensing region or device region 200. In the embodiment, the encapsulant layer may comprise molding materials or sealing materials.

According to the aforementioned embodiments, since the chip 100 comprises the first and second recesses 220 and 230 and a portion of the conducting structure/wire 440 is disposed therein, the size of the chip package is reduced. When the highest portion of the conducting structure/wire 440 is lower than the upper surface 100a through the first and second recesses 220 and 230, the size of the chip package can be reduced even further. Moreover, when the encapsulant layer further extends onto the upper surface 100a to form a flat contacting region above the sensing region or device region 200, the thickness of the encapsulant layer on the sensing region or device region 200 can be significantly reduced through the first and second recesses 220 and 230, such that the sensitivity of the sensing region or device region 200 is increased.

An exemplary embodiment of a method for forming a chip package according to the invention is illustrated with FIGS. 1 to 6, wherein FIGS. 1 to 6 are cross-sectional views of an exemplary embodiment of a method for forming a chip package according to the invention.

Figure 1:
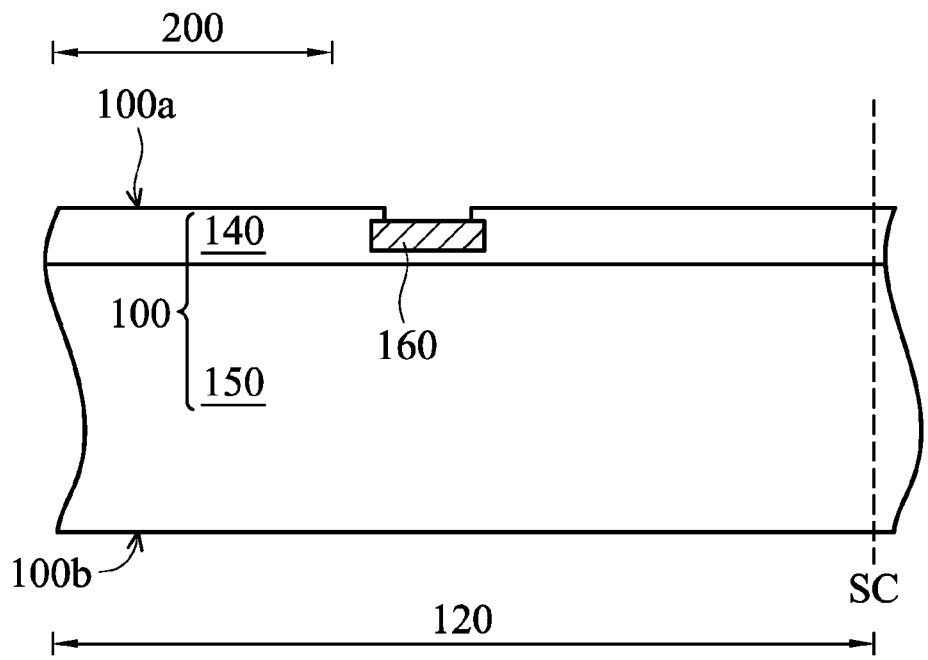
FIGS. 1-6 are cross-sectional views of an exemplary embodiment of a method for forming a chip package according to the invention.

Referring to FIG. 1, a wafer having a plurality of chip regions 120 is provided. A plurality of chips 100 is defined by the chip regions 120 and scribe lines SC are defined between the chip regions 120. To simplify the diagram, only a portion of the single chip region 120 is shown herein. The chip 100 has an upper surface 100a and a lower surface 100b. In one embodiment, the chip 100 comprises an insulating layer 140 adjacent to the upper surface 100a and an underlying substrate 150 adjacent to the lower surface 100b. In general, the insulating layer 140 may comprise an interlayer dielectric (ILD), an inter-metal dielectric (IMD) and a passivation layer. In the embodiment, the insulating layer 140 may comprise inorganic materials, such as silicon oxide, silicon nitride, silicon oxynitride, metal oxide, a combination thereof, or another suitable insulating material. In the embodiment, the substrate 150 may comprise silicon or another semiconductor material.

In the embodiment, the chip 100 in each chip region 120 may comprise a signal pad region 160 and a sensing region or device region 200 which are adjacent to the upper surface 100a. In one embodiment, the signal pad region 160 comprises a plurality of conducting pads and each conducting pad may be a single conducting layer or comprise multiple conducting layers. To simplify the diagram, only one conducting pad comprising a single conducting layer in the insulating layer 140 is depicted herein as an example. In the embodiment, the insulating layer 140 may comprise one or more openings exposing the respective conducting pads.

In one embodiment, the sensing region or device region 200 of the chip 100 comprises a sensing component which may be used for sensing biometric features (i.e., the chip 100 is a biometric sensing chip, such as a fingerprint-recognition chip). In another embodiment, the chip 100 may be used for sensing environmental features. For example, the chip 100 may comprise a temperature-sensing component, a humidity-sensing component, a pressure-sensing component, a capacitance-sensing component or another suitable sensing component. In yet another embodiment, the chip 100 may comprise an image-sensing component. In one embodiment, the sensing component in the chip 100 may be electrically connected to the signal pad region 160 by an interconnection structure (not shown) in the insulating layer 140.

Figure 2:
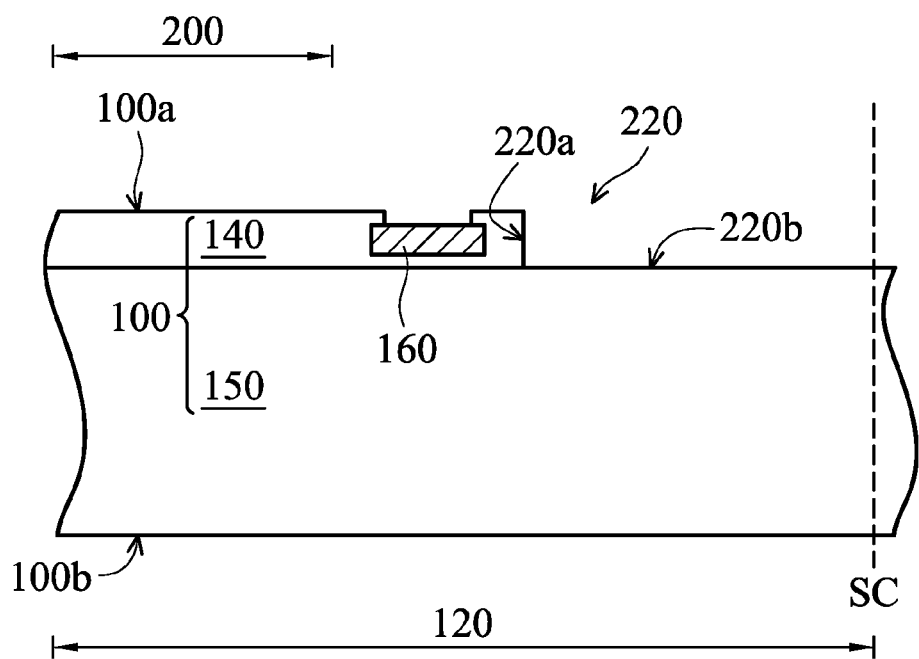

Referring to FIG. 2, a first recess 220 may be formed in the chip 100 in each chip region 120 by lithography and etching processes (the etching process may comprise a dry etching process, a wet etching process, a plasma etching process, a reactive ion etching process or another suitable process) or a dicing process. The first recess 220 is formed outside of the sensing region or device region 200 and the signal pad region 160 in each chip region 120 and extends from the upper surface 100a toward the lower surface 100b along the scribe line SC between the chip regions 120 to expose the underlying substrate 150. In other embodiments, the first recess 220 may be formed outside of the sensing region or device region 200 and expose the underlying substrate 150.

The first recess 220 has a first sidewall 220a and a first bottom 220b. In the embodiment, the first sidewall 220a is an edge of the insulating layer 140. Moreover, the first bottom 220b may be located at or lower than an interface between the insulating layer 140 and the substrate 150. In one embodiment, the first sidewall 220a may substantially be perpendicular to the upper surface 100a. In other embodiments, the first sidewall 220a may be inclined to the upper surface 100a. In addition, the first bottom 220b is not limited to being parallel to the upper surface 100a.

Referring to FIG. 3, one or more individual second recesses 230 may be formed in the chip 100 in each chip region 120 by lithography and etching processes (the etching process may comprise a dry etching process, a wet etching process, a plasma etching process, a reactive ion etching process or another suitable process) or a dicing process. The second recess 230 extends from the first bottom 220b of first recess 220 toward the lower surface 100b along the scribe line SC between the chip regions 120. The second recess 230 has a second sidewall 230a and a second bottom 230b. In the embodiment, the second sidewall 230a is substantially perpendicular to the upper surface 100a. In other embodiments, the second sidewall 230a may be inclined to the upper surface 100a. In addition, the second bottom 230b is not limited to being parallel to the upper surface 100a.

In the embodiment, the first recess 220 is has the depth D1 less than the depth D2 of the second recess 230, as shown in FIG. 3. Moreover, the first bottom 220b is has the width W1 less than the width W2 of the second bottom 230b, shown in FIG. 6.

Figure 4:
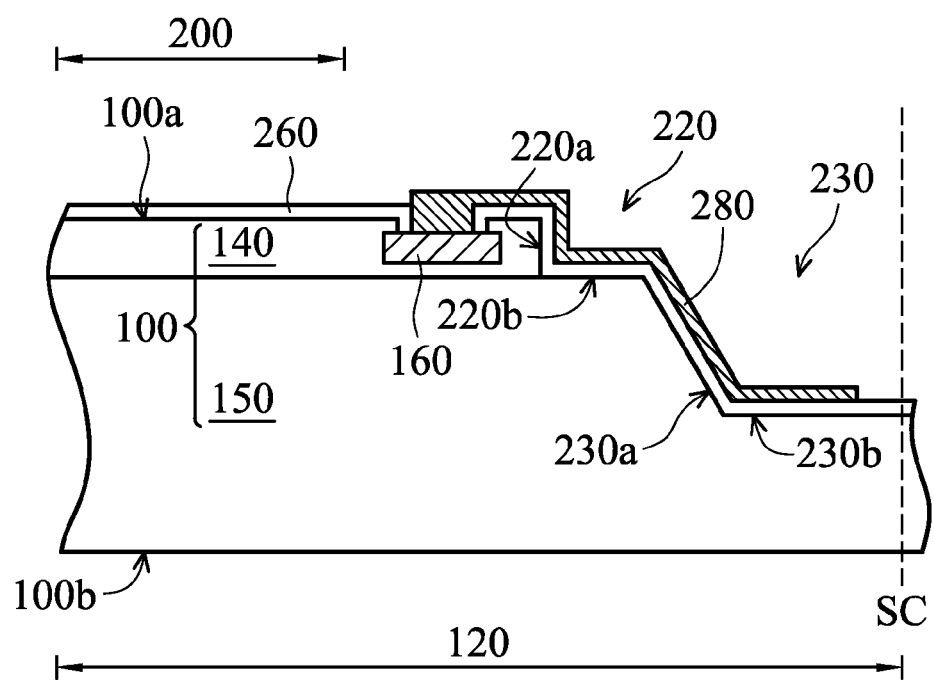

Referring to FIG. 4, an optional insulating layer 260 may be conformally formed on the upper surface 100a of the chip 100 by a deposition process (such as a coating process, a chemical vapor deposition process, a physical vapor deposition process or another suitable process). The insulating layer 260 extends to the second sidewall 230a and the second bottom 230b through the first recess 220. In the embodiment, the insulating layer 260 may comprise inorganic materials, such as silicon oxide, silicon nitride, silicon oxynitride, metal oxide, a combination thereof, or another suitable insulating material.

Next, a portion of the insulating layer 260 on the signal pad region 160 is removed by lithography and etching processes (the etching process may comprise a dry etching process, a wet etching process, a plasma etching process, a reactive ion etching process or another suitable process) to expose a portion of the signal pad region 160. A redistribution layer 280 is then patterned and conformally formed on the insulating layer 260 by a deposition process (such as a coating process, a chemical vapor deposition process, a physical vapor deposition process, an electroplating process, an electroless plating process or another suitable process) and lithography and etching processes. The redistribution layer 280 extends onto the second sidewall 230a and the second bottom 230b and is electrically connected to the exposed signal pad region 160. In one embodiment, the redistribution layer 280 does not reach an edge of the second bottom 230b. In one embodiment, when the substrate 150 comprises a semiconductor material, the redistribution layer 280 can be electrically insulated from the semiconductor material by the insulating layer 260. In one embodiment, the redistribution layer 280 may comprise copper, aluminum, gold, platinum, nickel, tin, a combination thereof, conductive polymer materials, conductive ceramic materials (such as indium tin oxide or indium zinc oxide), or another suitable conducting material.

Figure 5:
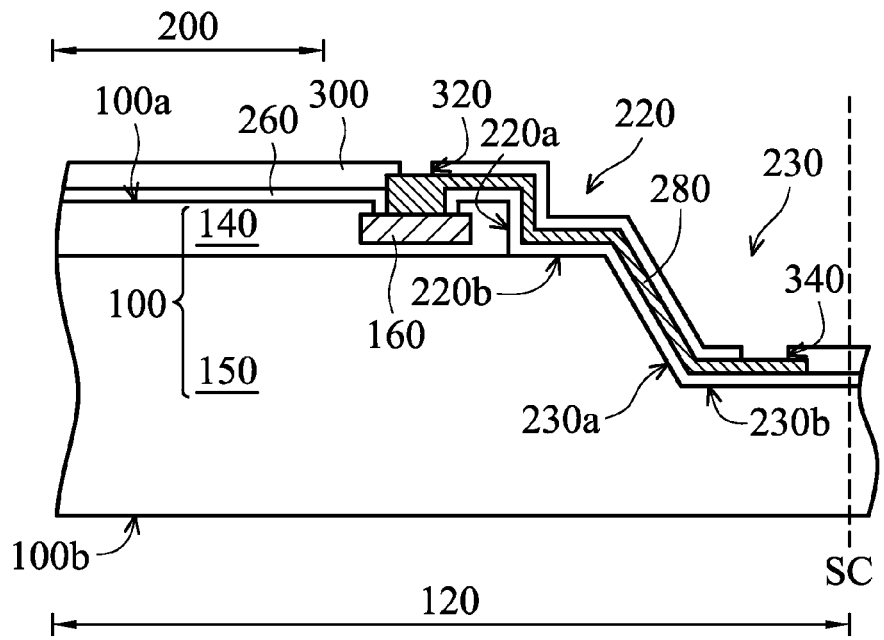

Referring to FIG. 5, a protection layer 300 may be conformally formed on the redistribution layer 280 and the insulating layer 260 by a deposition process (such as a coating process, a chemical vapor deposition process, a physical vapor deposition process or another suitable process). The protection layer 300 extends into the first recess 220 and the second recess 230. In the embodiment, the protection layer 300 may comprise inorganic materials, such as silicon oxide, silicon nitride, silicon oxynitride, metal oxide, a combination thereof, or another suitable insulating material.

Next, one or more openings may be formed in the protection layer 300 by lithography and etching processes (the etching process may comprise a dry etching process, a wet etching process, a plasma etching process, a reactive ion etching process or another suitable process) to expose a portion of the redistribution layer 280. In the embodiment, the protection layer 300 comprises openings 320 and 340 respectively exposing the redistribution layer 280 on the signal pad region 160 and in the second recess 230. In another embodiment, the protection layer 300 may merely comprise the opening 340. For example, the redistribution layer 280 on the signal pad region 160 may be fully covered by the protection layer 300. In other embodiments, the protection layer 300 may comprise a plurality of openings 340 exposing portions of the redistribution layer 280 in the second recess 230. It should be realized that the number and position of openings in the protection layer 300 are determined by design requirements and it is not limited thereto.

Next, a dicing process is performed in the chip 100 along the scribe lines SC between the chip regions 120 to form a plurality of independent chips. After performing the dicing process, the first recess 220 extends from the upper surface 100a toward the lower surface 100b along a sidewall of the chip 100 and the second recess 230 extends from the first bottom 220b toward the lower surface 100b along the sidewall of the chip 100. In one embodiment, the first recess 220 laterally extends to corners of the upper surface 100a and extends continuously across the entire length of four sides 101, 102, 103 and 104 of the upper surface 100a, such that the sides 101, 102, 103 and 104 shift toward the inside of the upper surface 100a, as shown in FIG. 7. In another embodiment, the first recess 220 may laterally extend across the entire length of the side 101 and further extend along the partial or entire length of the adjacent side 102 or 103 without extending along the side 104. In yet another embodiment, the first recess 220 may laterally extend across the entire length of the side 101 and further extend along the partial or entire length of the two adjacent sides 102 and 103 without extending along the side 104. In other embodiments, the first recess 220 may laterally extend along the partial or entire length of the side 101 without extending along the sides 102, 103 and 104.

In the embodiment, as shown in FIGS. 7 and 8, the chip package comprises a plurality of individual second recesses 230, which extend from the first bottom 220b toward the lower surface 100b along the partial length of the sides 101, 102, 103 and 104 of the upper surface 100a, respectively. Moreover, the length L1 of the first recess 220 extending along the side 101 is greater than the length L2 of the second recess 230 extending along the side 101. Similarly, the length of the first recess 220 extending along the side 102, 103 or 104 is greater than that of the respective second recess 230 extending along the same side 102, 103 or 104. In addition, although not shown in the figures, it should be realized that when the first recess 220 laterally extends across the full length or width of one side of the upper surface 100a, the second recess 230 laterally extending along the same side may have various configurations.

In the embodiment, the chip 100 comprises a step-like sidewall formed of the first and second sidewalls 220a and 230a and the first and second bottoms 220b and 230b, and an adjacent cliff-form sidewall formed of only the first sidewall 220a and the first bottom 220b, as shown in FIGS. 7 and 8, wherein FIG. 8 is a magnified perspective view of a portion P of the chip package shown in FIG. 7.

It is realized that the number of second recesses 230 shown in FIGS. 1 to 8 is illustrated as an example and not limited thereto. The actual number of second recesses 230 is determined by design requirements. For example, in one embodiment, two or more continuous second recesses 230 may be formed in the chip 100 by performing several dicing processes or lithography and etching processes, such that the chip 100 may comprise a multi-step sidewall formed of the first sidewall 220a, the first bottom 220b, the second sidewalls 230a and the second bottoms 230b.

Referring to FIG. 6, another chip, such as a processor, an interposer or a circuit board 380 is attached onto the lower surface 100b of the independent chip by an adhesive layer (such as a glue) 360 and is electrically connected to the signal pad region 160 through the redistribution layer 280 extending into the second recess 230 and a conducting structure 440, such as a conducting bump or a bonding wire. In other embodiments, a circuit board (not shown) may additionally be disposed under the chip or interposer 380 to form a stacked chip package.

Using the wire as an example, the wire 440 having a first end 440a and a second end 440b is formed by a wire bonding process. The first end 440a is formed on and electrically connected to the redistribution layer 280 extending into the second recess 230 through the opening 340. The second end 440b formed on and electrically connected to the chip, interposer or circuit board 380. For example, the second end 440b of the wire 440 may be formed initially and the first end 440a of the wire 440 may be formed subsequently. In other embodiments, the first end 440a of the wire 440 may be formed on and electrically connected to the redistribution layer 280 on the signal pad region 160 through the opening 320.

In one embodiment, the highest portion 440c of the wire 440 is lower than the upper surface 100a. In other embodiments, the highest portion 440c of the wire 440 may protrude from the upper surface 100a. Moreover, the wire 440 may comprise gold or another suitable conducting material. Since the chip 100 comprises the first and second recesses 220 and 230, the conducting path between the chip 100 and the chip, interposer or circuit board 380 can be led down from the upper surface 100a through the sidewall of the chip 100.

In one embodiment, an encapsulant layer (not shown) may be formed on the chip 100 by a molding process or another suitable process. The encapsulant layer optionally covers the conducting structure 440 and a portion of the chip 100 or it may further extend onto the upper surface 100a to form a flat contacting region above the sensing region or device region 200. In the embodiment, the encapsulant layer may comprise molding materials or sealing materials.

In one embodiment, when the highest portion 440c of the wire 440 is lower than the upper surface 100a through the first and second recesses 220 and 230, the entire height of the chip package is significantly reduced. Moreover, since the thickness of the encapsulant layer on the sensing region or device region 200 can also be reduced through the first and second recesses 220 and 230, the sensitivity of the sensing region or device region 200 is increased.

According to the aforementioned embodiments, since the highest portion of the conducting structure/wire 440 can be as low as possible by continuously forming the first and second recesses 220 and 230 in the chip 100, rather than forming only one recess and directly extending it downward which removes too much substrate material, the chip 100 can have sufficient structural strength. Furthermore, undercutting at an interface between the insulating layer 140 and the substrate 150 can be prevented. As a result, the quality of the chip package is improved. Moreover, the first recess laterally spanning the entire width or length of the chip 100 allows greater flexibility in routing output signals of the chip package.

While the invention has been described by way of example and in terms of the preferred embodiments, it is to be understood that the invention is not limited to the disclosed embodiments. On the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A chip package, comprising:
    a chip having an upper surface, a lower surface and a sidewall, wherein the chip comprises an insulating layer adjacent to the upper surface and a semiconductor substrate adjacent to the lower surface, and wherein the chip comprises a signal pad region in the insulating layer;
    a first recess extending from the upper surface toward the lower surface along the sidewall, wherein a first bottom of the first recess is lower than an interface between the insulating layer and the semiconductor substrate;
    at least one second recess extending from the first bottom of the first recess in the semiconductor substrate, wherein the first recess and the at least one second recess further laterally extend along a side of the upper surface, and a length of the first recess in the semiconductor substrate extending along the side is greater than that of the at least one second recess in the semiconductor substrate extending along the side; and
    a redistribution layer electrically connected to the signal pad region and extending into the at least one second recess.

2. The chip package as claimed in claim 1, wherein the first recess extends across an entire length of the side of the upper surface.

3. The chip package as claimed in claim 2, wherein the first recess further extends along at least a partial length of an adjacent side of the upper surface.

4. The chip package as claimed in claim 3, wherein the chip package comprises a plurality of second recesses extending along the side and the adjacent side of the upper surface, respectively.

5. The chip package as claimed in claim 2, wherein the first recess further extends along at least a partial length of two adjacent sides.

6. The chip package as claimed in claim 5, wherein the chip package comprises a plurality of second recesses extending from the first bottom of the first recess toward the lower surface along the side and at least one of the two adjacent sides of the upper surface, respectively.

7. The chip package as claimed in claim 1, wherein a depth of the first recess is less than that of the at least one second recess.

8. The chip package as claimed in claim 1, wherein the first bottom of the first recess has a width that is less than that of a second bottom of the at least one second recess.

9. The chip package as claimed in claim 1, further comprising an another chip, an interposer or a circuit board disposed under the lower surface and electrically connected to the redistribution layer.

10. A method for forming a chip package, comprising:
    providing a wafer having a plurality of chips, wherein each chip has an upper surface and a lower surface, and wherein the chip comprises an insulating layer adjacent to the upper surface and a semiconductor substrate adjacent to the lower surface, and comprises a signal pad region in the insulating layer;
    forming a first recess extending from the upper surface toward the lower surface, wherein a first bottom of the first recess is lower than an interface between the insulating layer and the semiconductor substrate;
    forming at least one second recess extending from the first bottom of the first recess toward the lower surface in the semiconductor substrate;

forming a redistribution layer electrically connected to the signal pad region and extending into the at least one second recess; and dicing the wafer to separate the plurality of chips, such that the each chip has a sidewall and the first recess extends along the sidewall, wherein the first recess and the at least one second recess further laterally extend a side of the upper surface, and wherein a length of the first recess in the semiconductor substrate extending along the side is greater than that of the at least one second recess in the semiconductor substrate extending along the side.

11. The method as claimed in claim 10, wherein the first recess extends across an entire length of the side of the upper surface.

12. The method as claimed in claim 11, wherein the first recess further extends along at least a partial length of an adjacent side of the upper surface.

13. The method as claimed in claim 12, wherein the method comprises forming a plurality of second recesses in each chip, wherein the plurality of second recesses extends along the side and the adjacent side of the upper surface, respectively.

14. The method as claimed in claim 11, wherein the first recess further extends along at least a partial length of two adjacent sides.

15. The method as claimed in claim 14, wherein the method comprises forming a plurality of second recesses in each chip, wherein the plurality of second recesses extends from the first bottom of the first recess toward the lower surface along the side and at least one of the two adjacent sides of the upper surface, respectively.

16. The method as claimed in claim 10, wherein a depth of the first recess is less than that of the at least one second recess.

17. The method as claimed in claim 10, wherein the first bottom of the first recess has a width that is less than that of a second bottom of the at least one second recess.

18. The method as claimed in claim 10, wherein the method further comprises disposing an another chip, an interposer or a circuit board under the lower surface and electrically connected to the redistribution layer.

* * * * *